(12) United States Patent
Kanamoto et al.

(10) Patent No.: US 7,964,424 B2
(45) Date of Patent: Jun. 21, 2011

(54) METHOD FOR MANUFACTURING NITRIDE SEMICONDUCTOR LIGHT-EMITTING ELEMENT

(75) Inventors: Kyozo Kanamoto, Tokyo (JP); Katsuomi Shiozawa, Tokyo (JP); Kazushige Kawasaki, Tokyo (JP); Shinji Abe, Tokyo (JP); Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 275 days.

(21) Appl. No.: 12/264,976

(22) Filed: Nov. 5, 2008

(65) Prior Publication Data

US 2009/0130790 A1 May 21, 2009

(30) Foreign Application Priority Data

Nov. 20, 2007 (JP) ................................. 2007-300602

(51) Int. Cl.
*H01L 21/00* (2006.01)
(52) U.S. Cl. .......... 438/39; 438/606; 438/796; 438/718; 257/E21.097; 257/E21.157
(58) Field of Classification Search .................... 438/39, 438/606, 605, 718, 796; 257/E21.097, E21.098, 257/E21.157, E21.172, E21.22, E21.222; 216/72, 74
See application file for complete search history.

(56) References Cited

U.S. PATENT DOCUMENTS

| 6,734,091 | B2 | 5/2004 | Oh et al. | |
|---|---|---|---|---|
| 7,101,780 | B2 | 9/2006 | Uemura | |
| 7,122,841 | B2* | 10/2006 | Oh et al. | 257/81 |
| 7,285,857 | B2 | 10/2007 | Kwak et al. | |
| 7,323,724 | B2 | 1/2008 | Sugimoto et al. | |
| 2002/0189532 | A1* | 12/2002 | Motoki et al. | 117/99 |
| 2003/0199171 | A1* | 10/2003 | Rice et al. | 438/710 |
| 2004/0159836 | A1* | 8/2004 | Sugimoto et al. | 257/40 |
| 2004/0209402 | A1* | 10/2004 | Chai et al. | 438/122 |
| 2004/0232429 | A1* | 11/2004 | Miki et al. | 257/79 |
| 2005/0067625 | A1* | 3/2005 | Hata | 257/81 |
| 2007/0023775 | A1* | 2/2007 | Jang | 257/99 |
| 2008/0006836 | A1* | 1/2008 | Lee | 257/98 |
| 2008/0230908 | A1* | 9/2008 | Igarashi | 257/751 |

FOREIGN PATENT DOCUMENTS

| CN | 1513211 A | 7/2004 |
|---|---|---|
| JP | 9-293898 A | 11/1997 |
| JP | 10-012567 A | 1/1998 |
| JP | 10-163529 A | 6/1998 |
| JP | 11-097744 A | 4/1999 |
| JP | 11-298040 A | 10/1999 |
| JP | 11-340511 A | 12/1999 |
| JP | 2004-095798 A | 3/2004 |
| JP | 2004-274042 A | 9/2004 |
| JP | 2005-136415 A | 5/2005 |
| WO | WO 2005/069389 A | 7/2005 |

* cited by examiner

*Primary Examiner* — Caridad M Everhart
(74) *Attorney, Agent, or Firm* — Leydig, Voit & Mayer, Ltd.

(57) ABSTRACT

A method for manufacturing a nitride semiconductor light-emitting element comprises: forming a semiconductor laminated structure wherein an n-type nitride semiconductor epitaxial layer, an active layer, and a p-type nitride semiconductor epitaxial layer are laminated on a substrate; forming a p-type electrode having a first electrode layer containing Pd and a second electrode layer containing Ta on the p-type nitride semiconductor epitaxial layer; heat treating at a temperature between 400° C. and 600° C. in ambient containing oxygen after forming the p-type electrode; and forming a pad electrode containing Au on the p-type electrode after the heat treating.

19 Claims, 9 Drawing Sheets

METHOD FOR MANUFACTURING NITRIDE SEMICONDUCTOR LIGHT-EMITTING ELEMENT

BACKGROUND OF THE INVENTION

1. Field of the Invention

The present invention relates to a method for manufacturing a nitride semiconductor light-emitting element wherein a p-type electrode is formed on a p-type nitride semiconductor epitaxial layer. More specifically, the present invention relates to a method for manufacturing a nitride semiconductor light-emitting element that can reduce the contact resistivity of a p-type electrode.

2. Background Art

When a high-output operation exceeding 200 mW is performed by a nitride semiconductor light-emitting element, the elevation of operating voltage causes a problem in the long burn-in test. To solve such a problem, a p-type electrode having a low resistance and uniform contact characteristics is required. As an electrode material that satisfies such requirement, Pd, that has a large work function is promising.

As the method for forming an electrode containing Pd as the major component on the surface of a nitride semiconductor such as GaN, methods wherein Pd is vapor-deposited on GaN, an electrode having a multilayer structure is formed, and heat treatment is performed, have been known, as disclosed, for example, in Japanese Patent No. 3519950, Japanese Patent No. 3579294, Japanese Patent No. 3233258, Japanese Patent No. 3309745, and Japanese Patent Application Laid-Open No. 2004-95798. Hereafter, the layer structure of an electrode is described as A/B/C. This means that layers A, B and C are laminated in this order from the substrate.

In Japanese Patent No. 3519950, and Japanese Patent No. 3579294, the use of Pd, which is a hydrogen-storage metal, as a p-type electrode is described. Thereby, hydrogen can be drawn from the nitride semiconductor to raise p-type carrier concentration and to reduce contact resistivity. There is also described that a Mo layer is formed on the Pd electrode as a barrier layer. Thereby, the Pd electrode is covered by Mo, which is a refractory metal, to prevent non-uniformity due to heat treatment. Although Mo is seemed to play a role for accelerating interfacial reaction, the role of Mo has not been completely understood.

Japanese Patent No. 3233258 describes the use of Pd/z/Au, where z is any of Pt, Ru, Rh, Os, Ir, and Ag. Thereby, nitrogen is drawn by the reaction between the p-type electrode and GaN, and the lowering of the carrier concentration is suppressed.

Japanese Patent No. 3309745 describes the heat treatment of the p-type electrode composed of Pd/Au or Au/Pd in an oxygen-containing atmosphere. By heat treatment in such an oxygen-containing atmosphere, contact resistivity can be lowered.

Japanese Patent Application Laid-Open No. 2004-95798 describes the use of Pd/z/Au, where z is any of Mo, Pt, W, Ir, Rh, and Ru; and heat treatment in a vacuum, N2, or Ar atmosphere before forming a Au layer. By heat treatment in such a state of a two-layer structure, hydrogen introduced in GaN during growing can be effectively removed.

SUMMARY OF THE INVENTION

Heretofore, it was difficult to stably obtain contact resistivity lower than 1E-3 $\Omega cm^2$ in the p-type electrode throughout the entire surface of the wafer. Therefore, when a nitride semiconductor light-emitting element was operated especially by a laser diode at an optical output of 200 mW or higher, degradation caused by the p-type electrode was resulted. Therefore, it was difficult to obtain acceptable products stably throughout the entire surface of the wafer.

To solve the above-described problems, it is an object of the present invention to obtain a method for manufacturing a nitride semiconductor light-emitting element that can lower the contact resistivity of a p-type electrode.

According to one aspect of the present invention, a method for manufacturing a nitride semiconductor light-emitting element comprises the steps of: forming a semiconductor laminated structure wherein an n-type nitride semiconductor epitaxial layer, an active layer, and a p-type nitride semiconductor epitaxial layer are laminated on a substrate; forming a p-type electrode having a first electrode layer containing Pd and a second electrode layer containing Ta on said p-type nitride semiconductor epitaxial layer; performing heat treatment at a temperature between 400° C. and 600° C. in atmosphere containing oxygen after forming said p-type electrode; and forming a pad electrode containing Au on said p-type electrode after performing said heat treatment.

According to the present invention, the contact resistivity of a p-type electrode can be lowered. As a result, a long-life laser diode capable of high-output operation with little time degradation can be obtained. Also by performing electrode metal vapor deposition prior to the insulating film forming process, electrode peeling can be suppressed, and a long-life laser diode capable of high-output operation with little time degradation can be obtained at high yield.

Other and further objects, features and advantages of the invention will appear more fully from the following description.

DETAILED DESCRIPTION OF THE PREFERRED EMBODIMENTS

Figure 1:
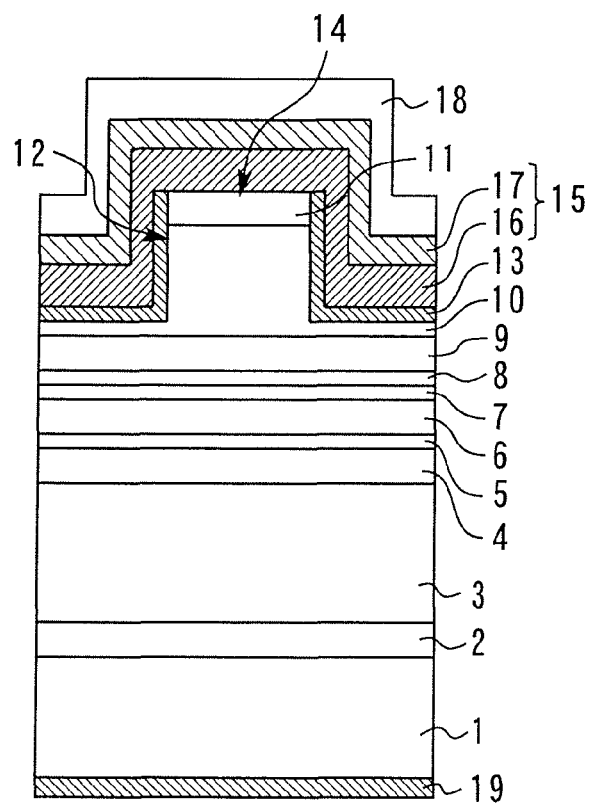
FIG. 1 is a sectional view showing a nitride semiconductor laser diode according to the Embodiment 1.

A method for manufacturing a nitride semiconductor light-emitting element according to the present invention will be described below using a nitride semiconductor laser diode as an example referring to the drawings. In each drawing, the same or equivalent parts are denoted by the same reference numerals, and the description thereof will be simplified or omitted.

Embodiment 1

FIG. 1 is a sectional view showing a nitride semiconductor laser diode according to the Embodiment 1. An n-type GaN buffer layer 2 is formed on the GaN surface, which is a major surface of a GaN substrate 1 (substrate). The n-type GaN buffer layer 2 is formed to reduce the irregularity of the surface of the GaN substrate 1 and to laminate upper layers as flatly as possible. An n-type AlGaN clad layer 3 is formed on the n-type GaN buffer layer 2.

On the n-type AlGaN clad layer 3, an n-type GaN light-guide layer 4 and an undoped InGaN light-guide layer 5 are sequentially laminated. On the InGaN light-guide layer 5, an active layer 6 having an undoped $In_xGa_{1-x}N/In_yGa_{1-y}N$ (0<x, y<1) multiple quantum well structure is formed.

On the active layer 6, an undoped $In_xGa_{1-x}N$ (0<x<1) optical waveguide layer 7 as a p-side light-guide layer, a p-type AlGaN electron barrier layer 8, a p-type GaN light-guide layer 9 as a p-side light-guide layer, a p-type AlGaN clad layer 10, and a p-type GaN contact layer 11 (p-type nitride semiconductor epitaxial layer) are sequentially laminated.

Here, the n-type GaN buffer layer 2 has a thickness of, for example, 1 μm, and is doped with, for example, Si as an n-type impurity. The n-type AlGaN clad layer 3 has a thickness of, for example, 2.0 μm, and is doped with, for example, Si as an n-type impurity, and the Al relative proportion is, for example, 0.05. The n-type GaN light-guide layer 4 has a thickness of, for example, 100 nm. The undoped InGaN light-guide layer 5 has a thickness of, for example, 7 nm, and the In relative proportion is, for example, 0.02.

The active layer 6 has a structure wherein $In_xGa_{1-x}N$ layers as barrier layers and $In_yGa_{1-y}N$ layers as well layers are alternately laminated, and the number of wells is, for example, 3. Each of the $In_xGa_{1-x}N$ layers has a thickness of, for example, 7 nm, and the relative proportion of, for example, 0.02. Each of the $In_yGa_{1-y}N$ layers has a thickness of, for example, 3.5 nm, and the relative proportion of, for example, 0.14.

The undoped $In_xGa_{1-x}N$ optical waveguide layer 7 has a thickness of, for example, 2.0 nm, and the In relative proportion x is, for example, 0.02. The p-type AlGaN electron barrier layer 8 has a thickness of, for example, 10 nm, and the Al relative proportion is, for example, 0.18. The p-type GaN light-guide layer 9 has a thickness of, for example, 100 nm. The p-type AlGaN clad layer 10 has a thickness of, for example, 400 nm, doped with, for example, Mg as the p-type impurity, and has an Al relative proportion of, for example, 0.07. The p-type GaN contact layer 11 has a thickness of, for example, 100 nm, doped with, for example, Mg as the p-type impurity, and a carrier concentration of $2E17$ $cm^{-3}$ or more, more preferably $5E17$ $cm^{-3}$ for obtaining a sufficiently low contact resistance.

On the p-type AlGaN clad layer 10 and the p-type GaN contact layer 11, a ridge 12 is formed by etching toward, for example, the <1-100> direction. The width of each ridge 12 is, for example, 2.0 μm. Here, the ridge 12 is formed on the location corresponding to a low-defect region present between high-dislocation regions having a width of several to several tens of micrometers formed in stripe shape on the GaN substrate 1.

For protecting and electrically insulating the surfaces of the sides and lateral bottom of the ridge 12, for example, a $SiO_2$ film 13 (insulating film) having a thickness of 200 nm is formed so as to coat the ridge 12. In the $SiO_2$ film 13, an opening 14 is formed in the portion corresponding to the upper surfaces of the ridge 12. The p-type electrode 15 is electrically connected to the p-type GaN contact layer 11 via the opening 14.

The p-type electrode 15 has a structure wherein a Pd layer 16 (first electrode layer) having a film thickness of 50 nm and a Ta layer 17 (second electrode layer) having a film thickness of 20 nm are sequentially laminated. On the p-type electrode 15, a pad electrode 18 for bonding the Ti/Ta/Au structure is formed. The Pd layer 16 can be substituted by a Pd—Ta alloy as the first electrode layer.

An n-type electrode 19 is formed on the back face of the GaN substrate 1. The n-type electrode 19 has a structure wherein, for example, Ti/Pt/Au films are sequentially laminated.

Next, the method for manufacturing a nitride semiconductor light-emitting element according to the Embodiment 1 will be described.

Figure 2:
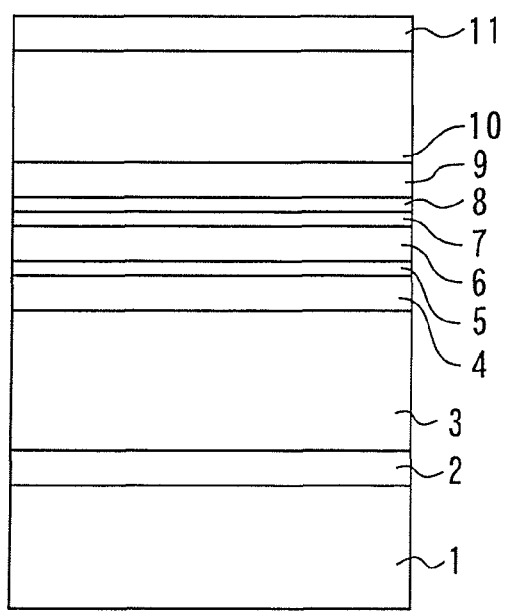
FIGS. 2-8 are sectional views for explaining a method of manufacturing a nitride semiconductor laser diode according to the Embodiment 1.

First, as shown in FIG. 2, on the Ga surface of a GaN substrate 1 the surface of which has been cleaned by thermal cleaning or the like in advance, an n-type GaN buffer layer 2 is grown by metal organic chemical vapor deposition (MOCVD) at, for example, a growing temperature of 1,000° C. Next, by MOCVD, an n-type AlGaN clad layer 3, an n-type GaN light-guide layer 4, an undoped InGaN light-guide layer 5, an undoped $In_xGa_{1-x}N/In_yGa_{1-y}N$ multiple quantum well active layer 6, an undoped InGaN optical waveguide layer 7, a p-type AlGaN electron barrier layer 8, a p-type GaN light-guide layer 9, a p-type AlGaN clad layer 10, and a p-type GaN contact layer 11 are sequentially laminated. Here, for example, the growing temperature for the n-type AlGaN clad layer 3 and the n-type GaN light-guide layer 4 is 1,000° C., the growing temperature for the undoped InGaN optical waveguide layer 7 to the undoped InGaN optical waveguide layer 7 is 740° C., and the growing temperature for the p-type AlGaN electron barrier layer 8 to the p-type GaN contact layer 11 is 1,000° C.

Figure 3:
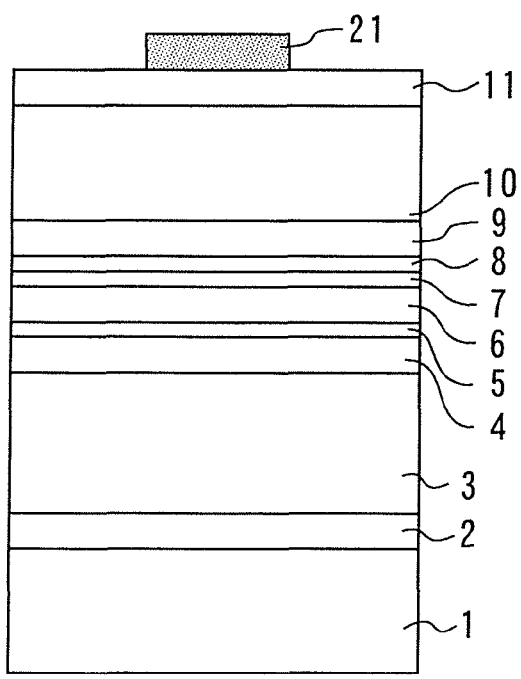

Next, as shown in FIG. 3, a resist is applied onto the entire surface of the wafer subjected to the above-described crystal growth, and a resist pattern 21 having a predetermined shape is formed by lithography (photoengraving).

Figure 4:
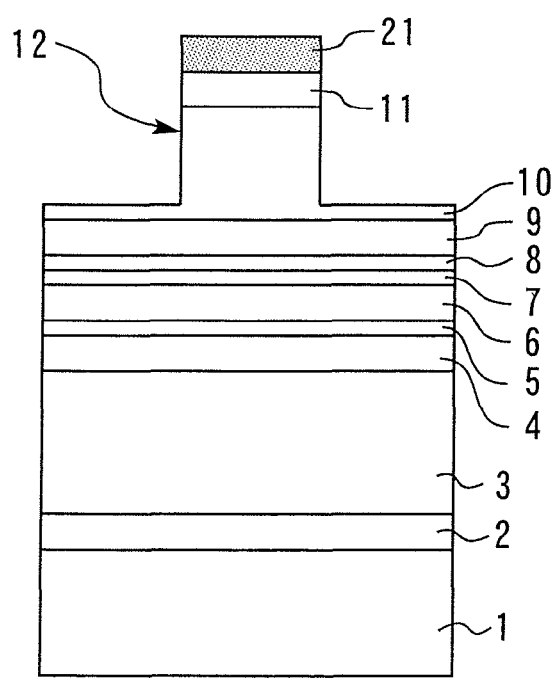

Next, as shown in FIG. 4, the p-type nitride semiconductor epitaxial layers are subjected to anisotropic etching to the inside of the p-type AlGaN clad layer 10 by RIE (Reactive Ion Etching) using the resist pattern 21 as a mask to form a ridge 12, which becomes a waveguide structure. As the etching gas, for example, a chlorine-based gas is used. By using an insulating film, such as $SiO_2$ film, as the etching mask in place of the resist pattern 21, the shape after etching becomes more vertical.

Figure 5:
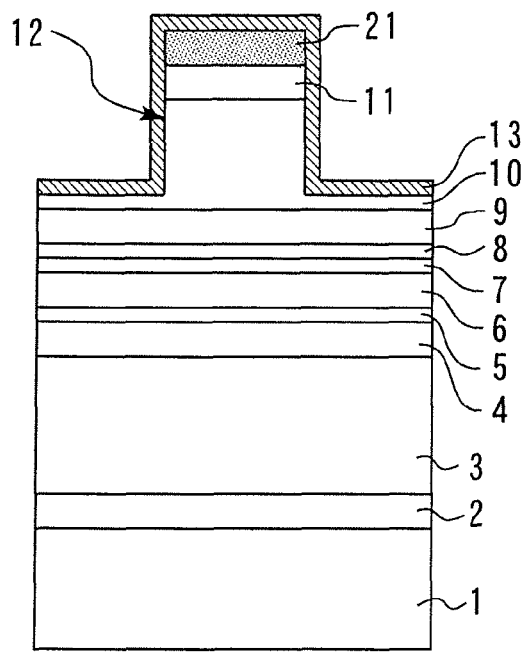

Next, as shown in FIG. 5, a $SiO_2$ film 13 having a thickness of 0.2 μm is formed on the entire surface by, for example, CVD, vacuum deposition, sputtering, or the like so as to coat the ridge 12 leaving the resist pattern 21.

Figure 6:
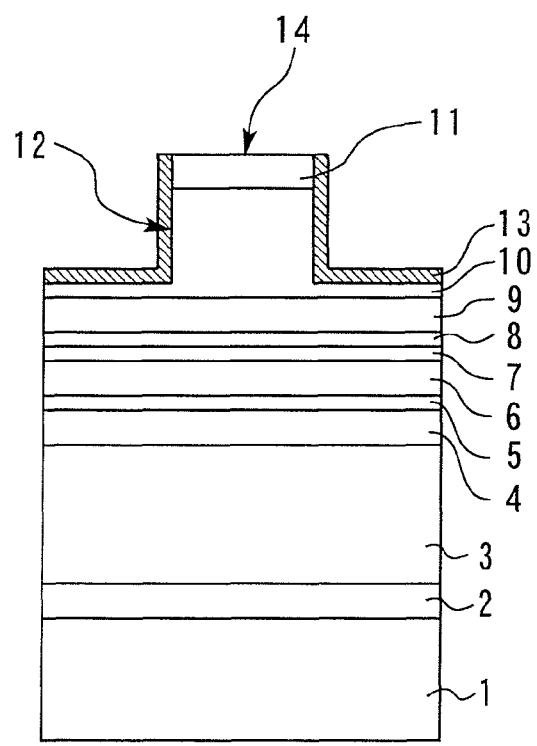

Next, a resist (not shown) is formed on the entire surface. Then, as shown in FIG. 6, the $SiO_2$ film 13 and the resist pattern 21 on the upper surface of the ridge 12 are simultaneously removed by etch back to form an opening 14.

Figure 7:
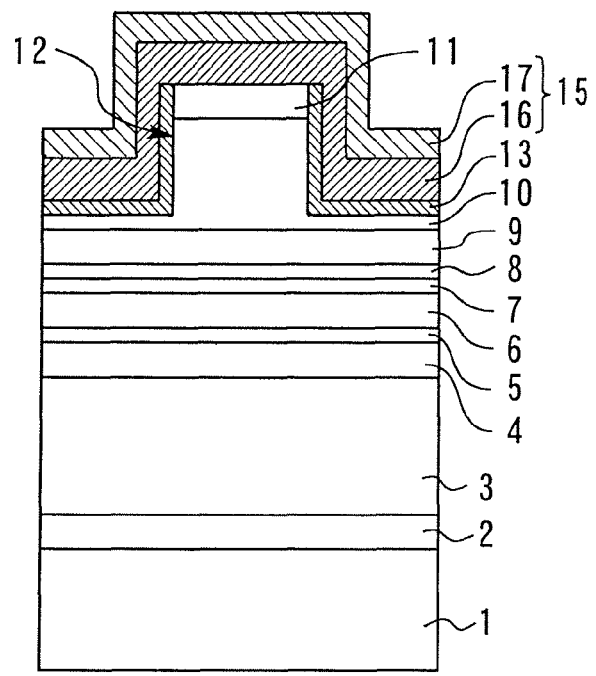

Next, a resist pattern having an opening (not shown) is formed on the region including the ridge 12 by lithography or the like. Thereafter, as shown in FIG. 7, a Pd layer 16 and a Ta layer 17 are sequentially formed on the entire surface as a p-type electrode 15 by, for example, electron beam (EB) vapor deposition. The film thickness of the Pd layer 16 can be about 20 to 100 nm, and the film thickness of the Ta layer 17 can be about 10 to 20 nm for obtaining the barrier effect to prevent the irregularity of the Pd layer 16 due to heat treatment. However, the thickness of the Pd layer 16 is preferably at least twice the thickness of the Ta layer 17, and the thickness of the Pd layer 16 is more preferably 30 nm or more. Thereafter, the Pd layer 16 and the Ta layer 17 are removed by lift off.

Next, using a RTA apparatus or the like, heat treatment is performed preferably within a temperature range between about 400° C. and 600° C., more preferably within a temperature range between about 450° C. and 550° C. Here, the temperature was 500° C. As atmosphere, oxygen or a mixed gas of a gas containing oxygen as the constituent gas and an inert gas is used. The content of oxygen is preferably 5% or more and less than 50%, more preferably 10% or more and less than 30%. Here, an atmosphere of 80% nitrogen and 20% oxygen was used. The temperature raising rate is preferably 10° C./sec or higher. Here, the temperature raising rate was 20° C./sec. The time for heat treatment can be 1 minute or longer. Here, it was 2 minutes.

Figure 8:
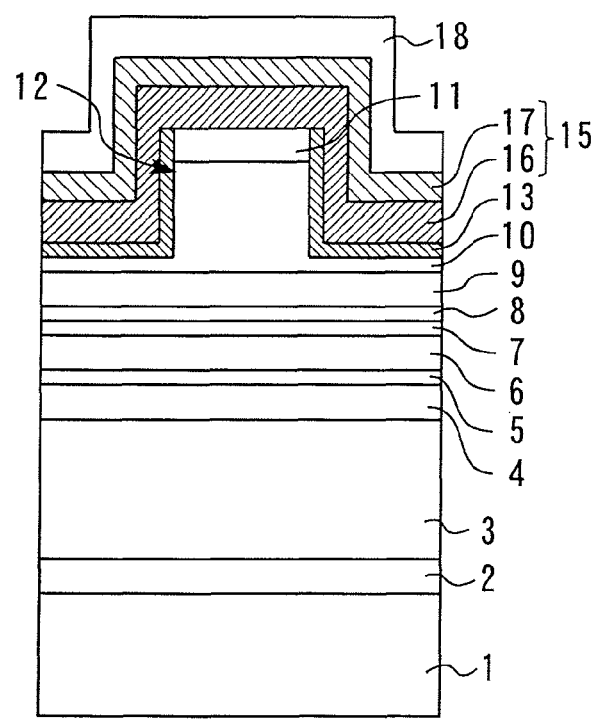

Next, after forming a pattern by transcription, a $SiO_2$ insulating film for isolation (not shown) is formed by lift off. Then, as shown in FIG. 8, Ti/Ta/Au to be a pad electrode 18 of thicknesses of, for example, 50 nm/100 nm/500 nm, respectively, are formed on the p-type electrode 15.

Next, the back face of the GaN substrate 1 is polished until the thickness of the wafer becomes about 100 μm for mirror finish. Then, the back face of the GaN substrate 1 is subjected to plasma treatment using an Ar mixed gas containing 5% SiCl4. Thereafter, water washing and oxygen plasma asher treatment are performed to form a high-carrier-concentration layer is formed. Then, the Ti/Pt/Au film is sequentially formed by vacuum vapor deposition. A resist is applied onto the entire surface of the wafer, and a resist pattern having a predetermined shape (not shown) is formed by lithography. The Ti/Pt/Au film is etched by ion milling using the resist pattern as a mask to form an n-type electrode 19. Thereafter, heat treatment is performed at a temperature of 400° C. or lower. However, even if the heat treatment is not performed, the n-type electrode 19 exhibits ohmic characteristics.

Next, the substrate is processed into bar shapes by cleavage or the like to form both resonator sides. Furthermore, these resonator sides are subjected to side coating, and the bars are cut into chips by cleavage or the like. Through the above-described processes, the nitride semiconductor laser diode according to the Embodiment 1 can be manufactured.

In the Embodiment 1, as described above, a Pd layer 16 is formed as a p-type electrode 15 on the p-type GaN contact layer 11. Here, Pd is a material the hydride producing energy of which is negative, and draws hydrogen when the residual hydrogen level in GaN is high. Thereby, since the carrier concentration can be effectively elevated, the contact resistivity can be reduced. However, the effect is little when the residual hydrogen level in GaN is sufficiently low. Furthermore, even if only the work function of Pd is high, a sufficiently low contact resistivity cannot be obtained. On the other hand, since the reactivity of Pd is higher than that of Au or Pt, Pd reacts with GaN to form a reactive layer having a low resistance, and the schottky barrier can be reduced.

In addition, since the reaction taking place during heat treatment has both positive and negative effects, an optimal range is present in heat treatment. Firstly, heating to at least 400° C. or higher is required for accelerating interfacial reaction. As the temperature becomes higher, the diffusion of oxygen, the suction of Ga, the suction of hydrogen, and the Pd—Ga reaction are accelerated. However, heating to 550° C. or higher results in the oxidation of the Ta layer, the diffusion of Ta to the interface, and the condensation of the electrode, and elevates the contact resistivity.

Figure 9:
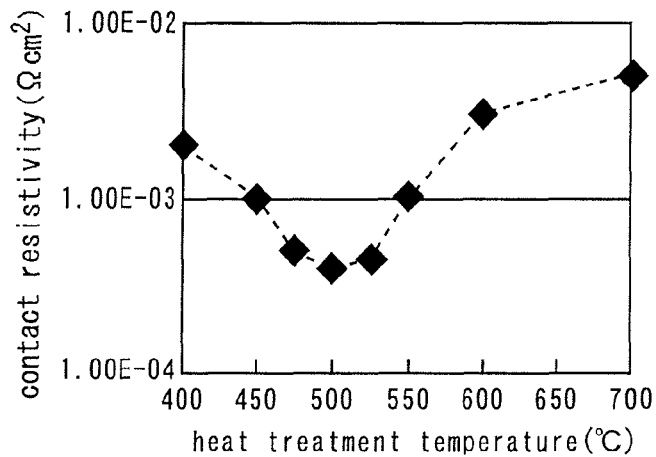
FIGS. 9-12 show experiment results of heat treatment temperature dependence of the contact resistivity.

As shown in FIG. 9, when heat treatment was performed in atmosphere of nitrogen:oxygen=4:1, it was found that the optimal value was present at 500±25° C., and the value of 1E-3 Ωcm2 or less, which is required for the high-output operation of the laser diode was obtained within the range of 500±50° C. Therefore, after forming the p-type electrode 15, by performing heat treatment in an oxygen-containing atmosphere at a temperature between 400° C. and 600° C., more preferably between 450° C. and 550° C., the contact resistivity of the p-type electrode can be reduced.

Also in the embodiment, a mixed gas of oxygen or a gas containing oxygen as the constituent element and an inert gas is used for the atmosphere in heat treatment to the p-type electrode 15. Oxygen in the atmosphere is diffused in the electrode during heat treatment, reaches the GaN/electrode interface, and draws Ga in GaN to accelerate the formation of Ga vacancies. Ga vacancies have been known to act as acceptors, and the contact resistivity can be lowered by acceptors formed by heat treatment. Therefore, by heat treatment in nitrogen atmosphere where oxygen is absent, contact resistivity cannot be sufficiently lowered. However, since the resistance is elevated when oxygen concentration is excessively high, an optimal range is present.

Figure 10:
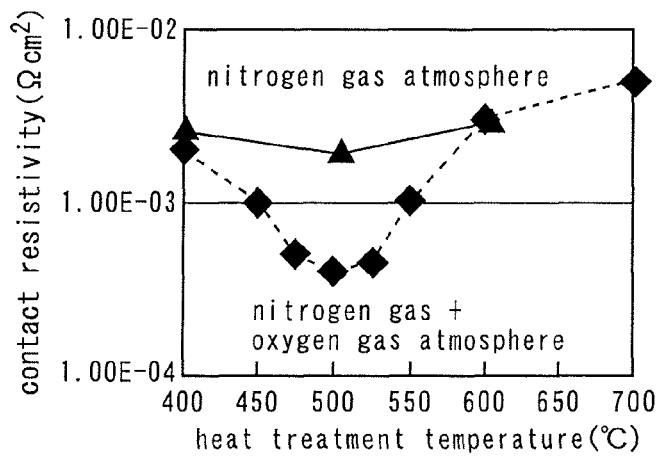

As shown in FIG. 10, extremely sensitive temperature dependence of heat treatment in nitrogen-and-oxygen atmosphere could not be found in the nitrogen gas atmosphere. Low resistance could not be obtained by heat treatment in the atmosphere of 60% oxygen. Therefore, by using a gas whose oxygen content is 5% or more and less than 50% as the atmosphere during heat treatment to the p-type electrode 15, the contact resistivity of the p-type electrode can be lowered.

Heretofore, a Mo layer has been formed on the Pd layer 16 as a barrier layer. Whereas, the inventors found that contact resistivity could be lowered when a Ta layer was used as the barrier layer in place of a Mo layer. The inventors also found that Mo cannot sufficiently resist acids, and is degraded by chemical-solution treatment or heat treatment after the formation of the electrode. Therefore, in the embodiment, a Ta layer 17 is formed on the Pd layer 16 as a barrier layer.

Figure 11:
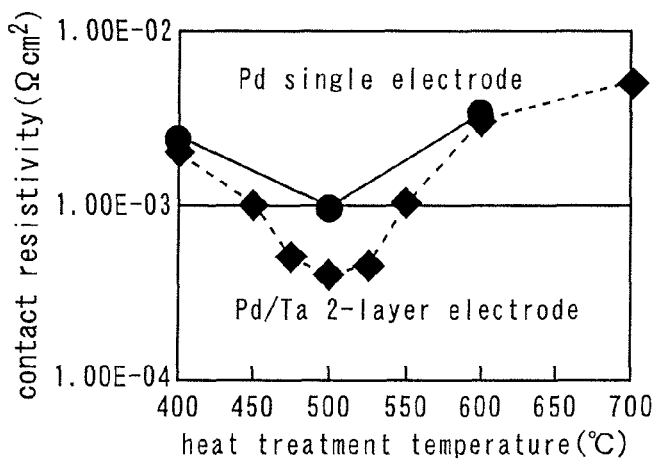

Also as shown in FIG. 11, when a Pd single layer electrode is used, contact resistivity is about twice the contact resistivity when a dual-layer electrode is used. Therefore, when heat treatment is performed in an oxygen-containing atmosphere, by making the p-type electrode 15 be a dual-layer electrode composed of a Pd layer 16 and a Ta layer 17, the contact resistivity of the p-type electrode 15 can be lowered.

Figure 12:
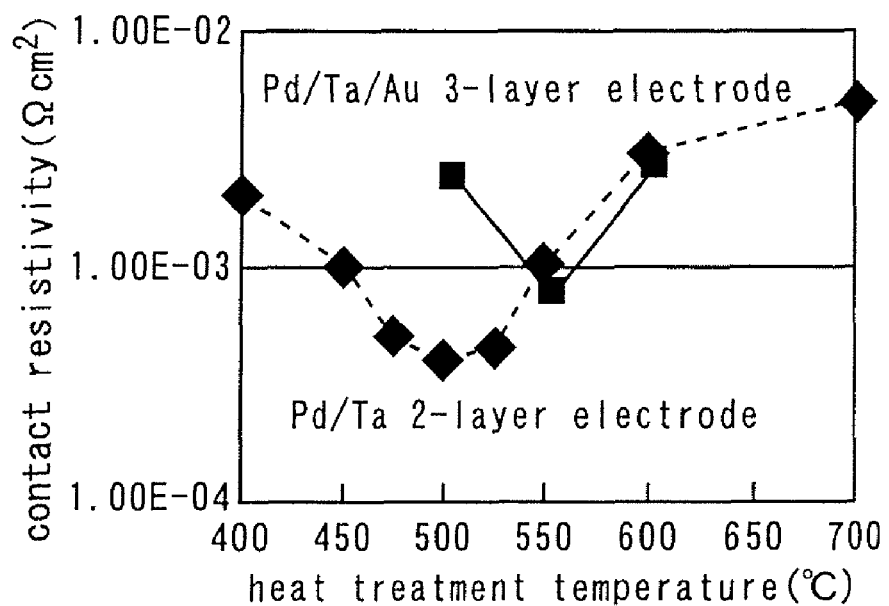

In the case of a p-type electrode having a three-layer structure wherein a Pd layer, a Ta layer, and a Au layer are sequentially formed, the diffusion of oxygen is interfered during heat treatment, and interfacial reaction does not sufficiently take place. Therefore, as shown in FIG. 12, contact resistivity cannot be sufficiently lowered in the case of a three-layer electrode compared with a dual-layer electrode. In addition, it is known that since interfacial reaction is hard to take place when the layer of Au or the like having the action to suppress the diffusion of oxygen, the temperature at which the contact resistivity is lowered shifts to the high-temperature side. This is the same when a pad electrode is formed on a p-type electrode having a dual-layer structure composed of a Pd layer and a Ta layer, and is thereafter subjected to heat treatment. In the embodiment, therefore, the pad electrode is formed after the p-type electrode has been subjected to heat treatment. Thereby, the contact resistivity of the p-type electrode can be lowered.

Also by forming the n-type electrode after performing plasma treatment to the back face of the substrate, carriers of a high concentration can be formed on the back face of the substrate by heat treatment at relatively low temperature of 400° C. or lower. Therefore, since the degradation of the p-type electrode due to the process for forming the n-type electrode can be prevented, the contact resistivity of the p-type electrode can be lowered.

According to the embodiment, as described above, the contact resistivity of the p-type electrode can be lowered. Thereby, the power consumption of the p-type electrode can be lowered even if the laser driving current is increased.

Therefore, a long-life laser diode with little time degradation enabling high-output operation can be obtained.

Figure 13:
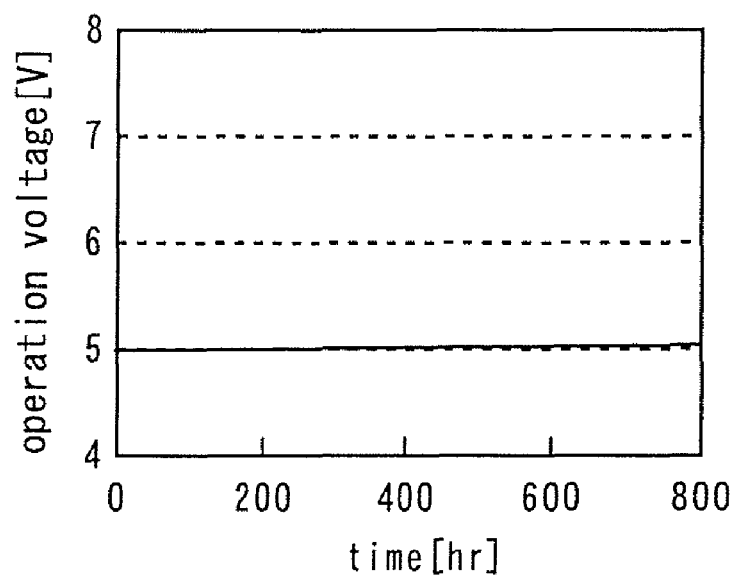
FIG. 13 shows an experiment result of time dependence of the operation voltage.

The nitride semiconductor laser diode manufactured through the above-described processes had a threshold voltage of 30 mA, and an operation voltage at 100 mW of about 5 V. As shown in FIG. 13, as a result of the continuous burn-in test, the variation of the operation voltage was not more than 10% over 500 hours or longer. Therefore, in the burn-in test for high output, it was confirmed that the state of a low contact resistivity of the p-type electrode can be maintained for a long time.

Embodiment 2

Next, the method for manufacturing a nitride semiconductor light-emitting element according to the Embodiment 2 will be described.

First, as shown in FIG. 2, on a GaN substrate 1, a nitride semiconductor epitaxial layer is formed in the same manner as in the Embodiment 1.

Figure 14:
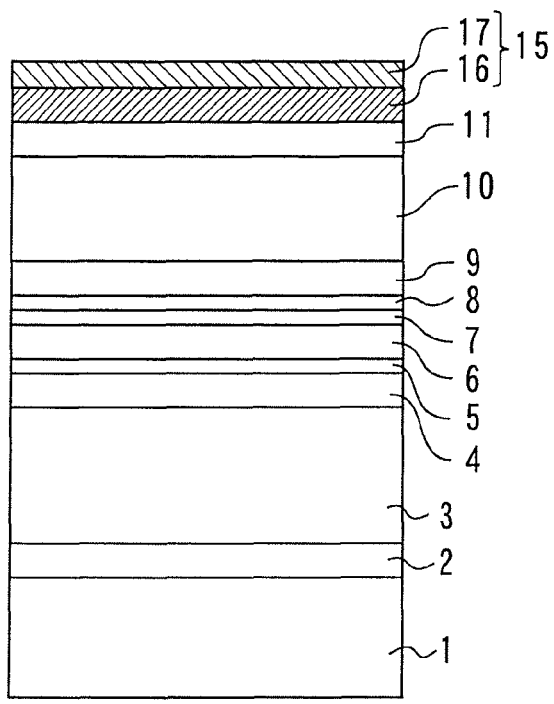
FIGS. 14-19 are sectional views for explaining a method of manufacturing a nitride semiconductor laser diode according to the Embodiment 2.

Next, as shown in FIG. 14, a Pd layer 16 and a Ta layer 17 are sequentially formed by electron beam (EB) vapor deposition and lift off as a p-type electrode 15.

Figure 15:
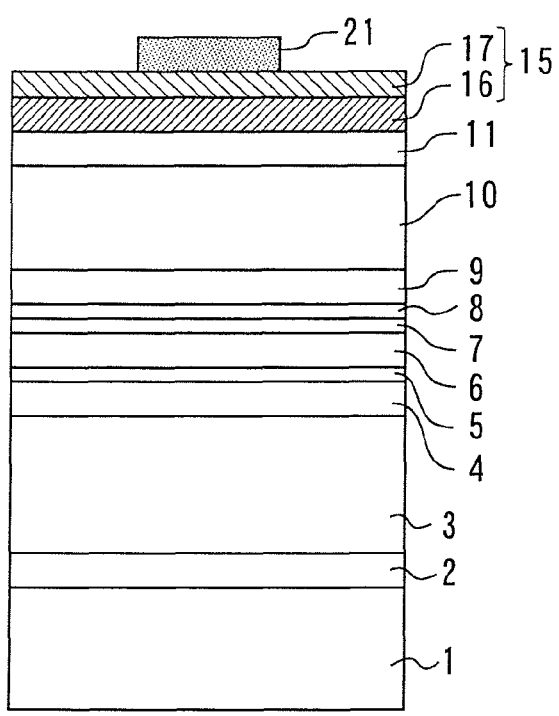

Next, as shown in FIG. 15, a resist is applied onto the entire surface of the wafer subjected to the above-described crystal growth, and a resist pattern 21 having a predetermined shape is formed by lithography (photoengraving).

Figure 16:
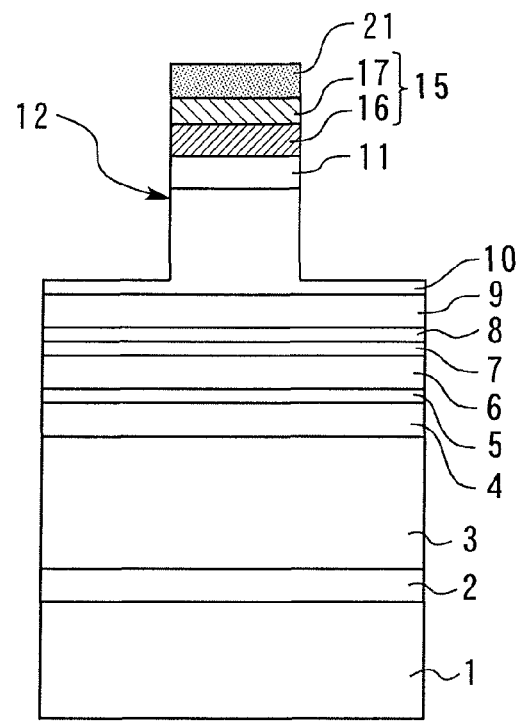

Next, as shown in FIG. 16, the p-type electrode 15 and the p-type nitride semiconductor epitaxial layers are subjected to anisotropic etching to the inside of the p-type AlGaN clad layer 10 by RIE or the like using the resist pattern 21 as a mask to form a ridge 12, which becomes a waveguide structure. As the etching gas, for example, a chlorine-based gas is used. The etching of the p-type electrode 19 was simultaneously performed with dry etching for forming the ridge 12 using the same resist pattern 21.

Figure 17:
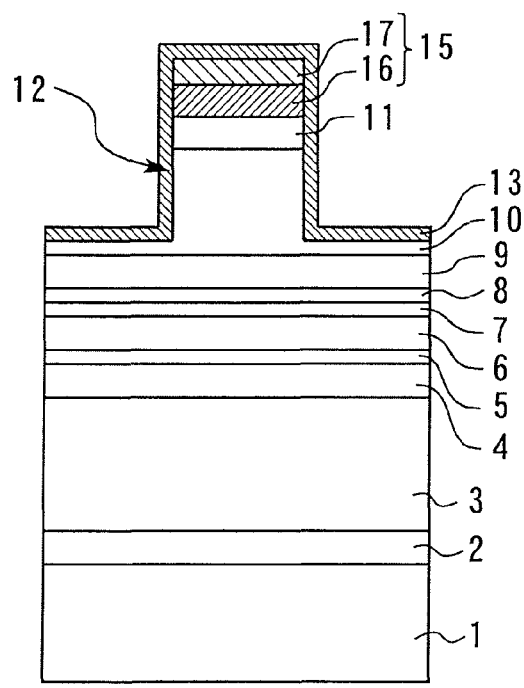

Next, as shown in FIG. 17, a $SiO_2$ film 13 having a thickness of 0.2 μm is formed on the entire surface by, for example, CVD, vacuum deposition, sputtering, or the like so as to coat the ridge 12.

Figure 18:
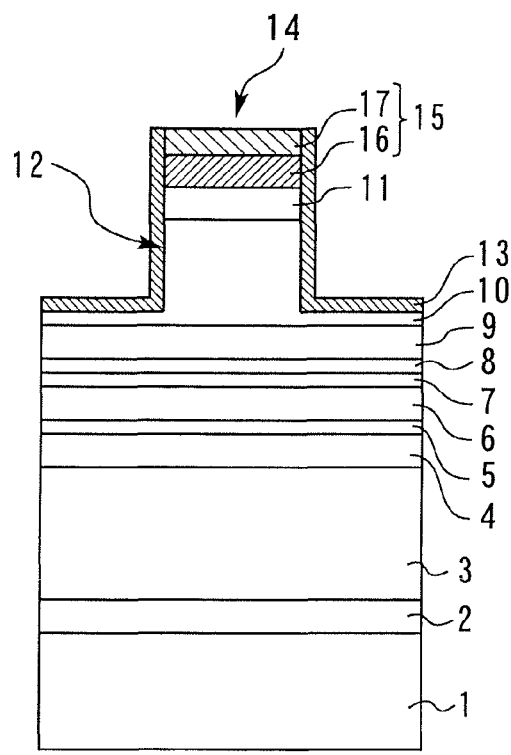

Next, a resist (not shown) is formed on the entire surface. Then, as shown in FIG. 18, the $SiO_2$ film 13 on the ridge 12 is removed by etch back to form an opening 14. Thereafter, heat treatment is performed in the same manner as in the Embodiment 1.

Figure 19:
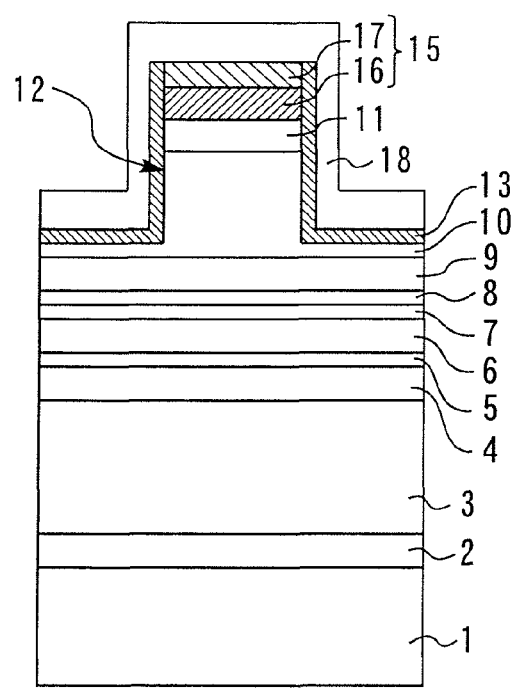

Next, as shown in FIG. 19, Ti/Ta/Au to be a pad electrode 18 of thicknesses of, for example, 50 nm/100 nm/500 nm, respectively, are formed on the p-type electrode 19. Thereafter, an n-type electrode 19 is formed in the same manner as in the Embodiment 1, and by performing chipping or the like, the nitride semiconductor laser diode according to the Embodiment 2 can be manufactured.

In the Embodiment 1, the p-type electrode 19 was formed after forming the ridge 12 and the $SiO_2$ film 13. Therefore, since the adhesion of the p-type electrode 19 using Pd with the $SiO_2$ film 13 was weak, the Embodiment 1 had a problem wherein the p-type electrode was peeled off during the process. In the Embodiment 2, therefore, the p-type electrode 19 is formed before forming the ridge 12 and the $SiO_2$ film 13. Thereby, since the p-type electrode 19 is not formed on the $SiO_2$ film 13, the peeling of the p-type electrode 19 is suppressed. Therefore, the p-type electrode 19 without irregularity can be obtained throughout the entire face of the wafer.

Although the above-described embodiments have been described using a nitride semiconductor laser diode as an example, the present invention is not limited thereto, but can also be applied to any nitride semiconductor light-emitting elements other than laser diodes, such as light-emitting diodes (LEDs).

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-300602, filed on Nov. 20, 2007 including specification, claims, drawings and summary, on which the Convention priority of the present application is based, are incorporated herein by reference in its entirety.

What is claimed is:

1. A method for manufacturing a nitride semiconductor light-emitting element comprising:
    forming a semiconductor laminated structure wherein an n-type nitride semiconductor epitaxial layer, an active layer, and a p-type nitride semiconductor epitaxial layer are laminated on a substrate;
    forming a p-type electrode having a first electrode layer containing Pd and a second electrode layer containing Ta on said p-type nitride semiconductor epitaxial layer;
    heat treating at a temperature between 400° C. and 600° C. in an ambient containing oxygen, after forming said p-type electrode;
    forming a pad electrode containing Au on said p-type electrode, after the heat treating;
    anisotropically etching said p-type electrode and said p-type nitride semiconductor epitaxial layer to form a ridge, after forming said p-type electrode; and
    forming an insulating film coating on said ridge.

2. The method for manufacturing a nitride semiconductor light-emitting element according to claim 1, including heat treating at a temperature between 450° C. and 550° C.

3. The method for manufacturing a nitride semiconductor light-emitting element according to claim 1, wherein a GaN single crystal substrate is used as said substrate, and including forming said semiconductor laminated structure on the Ga surface of said GaN single crystal substrate.

4. The method for manufacturing a nitride semiconductor light-emitting element according to claim 1, wherein said first electrode layer is a Pd—Ta alloy.

5. The method for manufacturing a nitride semiconductor light-emitting element according to claim 1, including, in the heat treating, increasing the temperature at a rate of at least 10° C./sec.

6. The method for manufacturing a nitride semiconductor light-emitting element according to claim 1, wherein the ambient including oxygen is a mixture of oxygen or a gas containing oxygen as a constituent element and an inert gas, the oxygen content of the mixture being at least 5% and less than 50%.

7. The method for manufacturing a nitride semiconductor light-emitting element according to claim 1, wherein said p-type nitride semiconductor epitaxial layer includes a contact layer having a carrier concentration of at least 2E17 $cm^{-3}$ and including forming said first electrode layer on said contact layer.

8. The method for manufacturing a nitride semiconductor light-emitting element according to claim 1, further comprising:
    forming an n-type electrode after plasma treating a back face of said substrate; and
    heat treating at a temperature not exceeding 400° C.

9. The method for manufacturing a nitride semiconductor light-emitting element according to claim 1, wherein said first electrode layer has a thickness at least twice the thickness of said second electrode layer.

10. The method for manufacturing a nitride semiconductor light-emitting element according to claim 9, wherein the thickness of said first electrode layer is at least 30 nm.

11. A method for manufacturing a nitride semiconductor light-emitting element comprising:
    forming a semiconductor laminated structure including sequentially forming, on a substrate, an n-type nitride semiconductor epitaxial layer, an active layer, and a p-type nitride semiconductor epitaxial layer;
    forming a first electrode consisting of a first electrode layer in physical contact with said p-type nitride semiconductor epitaxial layer and containing Pd, and a second electrode layer in physical contact with said first electrode layer and containing Ta;
    heat treating said first electrode and said semiconductor laminated structure at a temperature between 400° C. and 600° C. in an ambient containing oxygen, after forming said first electrode;
    forming a pad electrode containing Au on said first electrode, after the heat treating;
    anisotropically etching said first electrode and said p-type nitride semiconductor epitaxial layer to form a ridge, after forming said first electrode; and
    forming an insulating film coating on said ridge.

12. The method for manufacturing a nitride semiconductor light-emitting element according to claim 11, wherein said substrate is a GaN single crystal substrate, and including forming said semiconductor laminated structure on a Ga surface of said GaN single crystal substrate.

13. The method for manufacturing a nitride semiconductor light-emitting element according to claim 11, wherein said first electrode layer is at least twice as thick as said second electrode layer.

14. The method for manufacturing a nitride semiconductor light-emitting element according to claim 13, wherein said first electrode layer is at least 30 nm thick.

15. The method for manufacturing a nitride semiconductor light-emitting element according to claim 11, wherein said first electrode layer is a Pd—Ta alloy.

16. The method for manufacturing a nitride semiconductor light-emitting element according to claim 11, including, in the heat treating, increasing the temperature at a rate of at least 10° C./sec.

17. The method for manufacturing a nitride semiconductor light-emitting element according to claim 11, wherein the ambient including oxygen is a mixture of (i) oxygen or a gas containing oxygen as a constituent element, and (ii) an inert gas, the oxygen content of the mixture being at least 5% and less than 50%.

18. The method for manufacturing a nitride semiconductor light-emitting element according to claim 11, wherein said p-type nitride semiconductor epitaxial layer includes a contact layer having a carrier concentration of at least $2E17\ cm^{-3}$, and including forming said first electrode layer in physical contact with said contact layer.

19. The method for manufacturing a nitride semiconductor light-emitting element according to claim 11, further comprising:
    forming a second electrode in physical contact with a back face of said substrate after plasma treating said back face of said substrate; and
    heat treating said first and second electrodes and said semiconductor laminated structure at a temperature not exceeding 400° C.

* * * * *